United States Patent
Lu et al.

(10) Patent No.: US 12,131,778 B2
(45) Date of Patent: Oct. 29, 2024

(54) TRIGGERING OF STRONGER WRITE PULSES IN A MEMORY DEVICE BASED ON PRIOR READ OPERATIONS

(71) Applicant: Micron Technology, Inc., Boise, ID (US)

(72) Inventors: Zhongyuan Lu, Boise, ID (US); Robert John Gleixner, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 259 days.

(21) Appl. No.: 17/895,988

(22) Filed: Aug. 25, 2022

(65) Prior Publication Data

US 2024/0071491 A1 Feb. 29, 2024

(51) Int. Cl.
*G11C 7/00* (2006.01)
*G11C 13/00* (2006.01)

(52) U.S. Cl.
CPC ...... *G11C 13/0069* (2013.01); *G11C 13/0004* (2013.01); *G11C 13/0033* (2013.01); *G11C 13/0035* (2013.01); *G11C 13/004* (2013.01)

(58) Field of Classification Search
CPC ....... G11C 7/1051; G11C 7/22; G11C 7/1072; G11C 7/1078
USPC ............. 365/189.15, 189.14, 189.16, 185.19
See application file for complete search history.

(56) References Cited

U.S. PATENT DOCUMENTS

2015/0049563 A1* 2/2015 Maiti ................. G11C 7/22
365/194

* cited by examiner

*Primary Examiner* — Son T Dinh
(74) *Attorney, Agent, or Firm* — Greenberg Traurig

(57) ABSTRACT

Systems, methods, and apparatus to select an enhanced write pulse for a write operation in a memory device. In one approach, stronger reset pulses are triggered when there is an increased risk of memory cell threshold voltage degradation. Memory cells read by a relatively higher number of read operations are recorded by a controller of a memory device by updating a lookup table with addresses of the memory cells read. For a new write operation, the controller determines if a reset on set write operation is to be performed. The controller also searches the lookup table to determine if an address for the target bits or codeword of the write operation are in the lookup table. If both conditions are satisfied, then the magnitude of the write pulse is increased for programming the memory cells.

27 Claims, 9 Drawing Sheets

TRIGGERING OF STRONGER WRITE PULSES IN A MEMORY DEVICE BASED ON PRIOR READ OPERATIONS

FIELD OF THE TECHNOLOGY

At least some embodiments disclosed herein relate to memory devices in general, and more particularly, but not limited to memory devices that determine whether to enhance a write pulse using a lookup table or other record associated with prior read operations.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A storage device is an example of a memory device. Typical computer storage devices have controllers that receive data access requests from host computers and perform programmed computing tasks to implement the requests in ways that may be specific to the media and structure configured in the storage devices. In one example, a memory controller manages data stored in memory and communicates with a computer device. In some examples, memory controllers are used in solid state drives for use in mobile devices or laptops, or media used in digital cameras.

Firmware can be used to operate a memory controller for a particular storage device. In one example, when a computer system or device reads data from or writes data to a memory device, it communicates with the memory controller.

Memory devices typically store data in memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others.

In one example, reading a set of data (e.g., a codeword, a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multi-level cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

A PCM cell, for example, may be programmed to a reset state (amorphous state) or a set state (crystalline state). For example, a reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely for example, a set pulse (e.g., a pulse used to program a cell to a set state) can include a relatively lower current pulse applied to the cell for a relatively longer time interval and with a slower quenching speed, which results in an increased crystallization of the phase change material.

A programming signal can be applied to a selected memory cell to program the cell to a target state. A read signal can be applied to a selected memory cell to read the cell (e.g., to determine the state of the cell). The programming signal and the read signal can be current and/or voltage pulses, for example.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
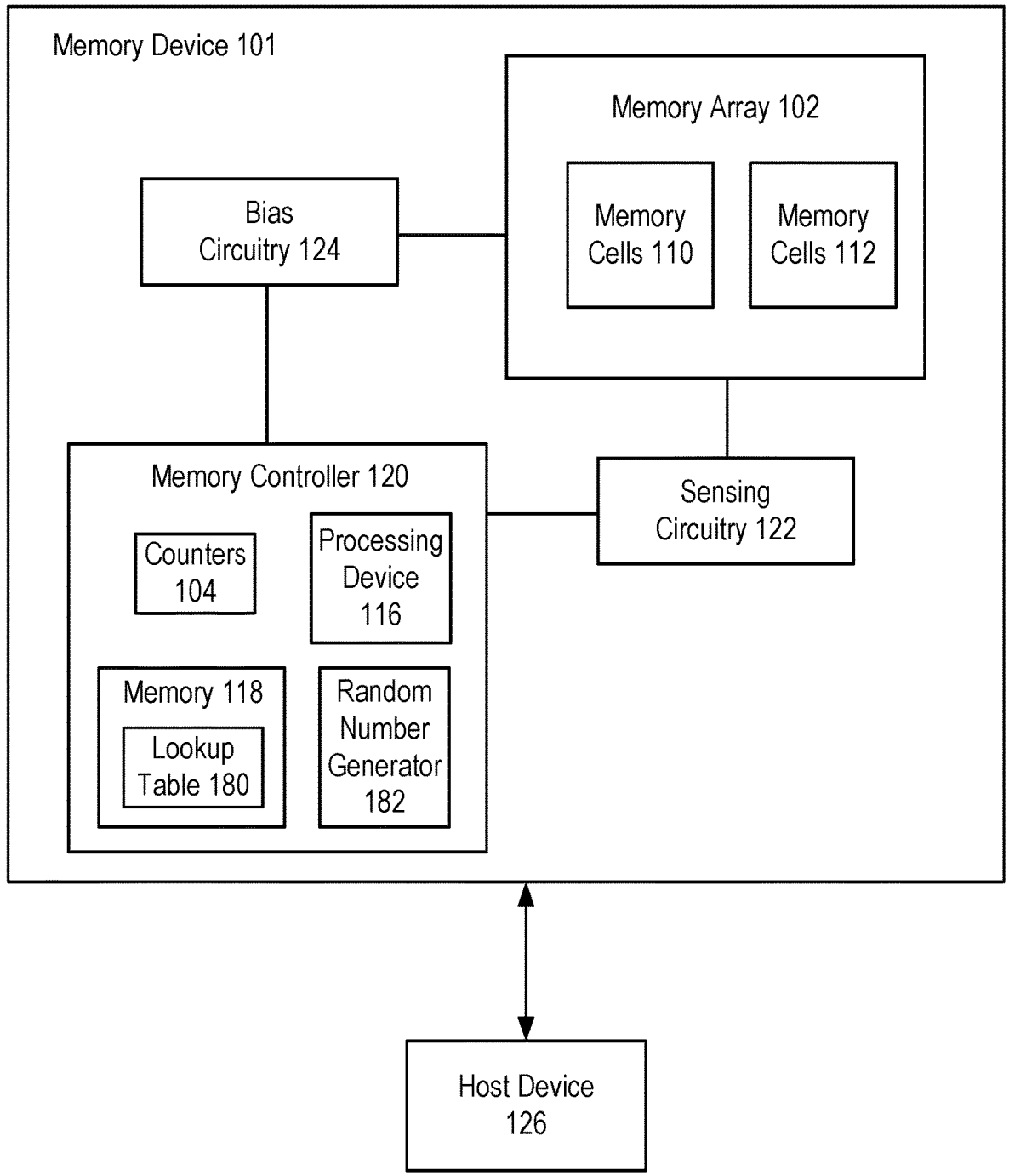
FIG. 1 shows a memory device having a controller that determines whether to enhance a write pulse by searching a lookup table associated with prior read operations, in accordance with some embodiments.

The following disclosure describes various embodiments for memory devices that determine whether to enhance (e.g., make stronger by increasing magnitude of a voltage and/or current associated with one or more memory cells) a write pulse using a lookup table or other record associated with prior read operations (e.g., reading of memory cells in a three-dimensional cross-point memory array). At least some embodiments herein relate to memory devices that use bipolar operations for a memory array. In one example, bipolar select voltages are used to select memory cells of the memory array. In one example, the memory cells are arranged in a cross-point architecture. In one example, each memory cell is formed using a single select device. In one example, the select device includes a chalcogenide material that switches or snaps when a sufficient voltage is applied across the memory cell.

The memory device may, for example, store data used by a host device (e.g., a computing device of an autonomous vehicle, or a data center server that accesses data stored in the memory device). In one example, the memory device is a solid-state drive mounted in an electric vehicle.

In some cases, a memory device may include an array of memory cells arranged in a three-dimensional (3D) architecture, such as a cross-point architecture, to store the set of data. The memory cells in a cross-point architecture may, for example, represent a first logic state (e.g., a logic 1, a SET state) associated with a first set of threshold voltages, or a second logic state (e.g., a logic 0, a RESET state) associated with a second set of threshold voltages.

In other embodiments, the memory cells may be arranged in a three-dimensional (3D) vertical architecture. A 3D vertical architecture may include memory cells located at the crossing between a vertical access line (e.g., a bit line pillar), and each one of a plurality of second access lines (e.g., word lines), formed in horizontal planes or decks parallel to each other.

It should be noted that, merely for purposes of discussion, a RESET state is sometimes referred to herein as simply a "RST" state, or indicated by an "RST" notation.

More generally, an integrated circuit memory cell, such as a memory cell in a cross-point memory or a 3D vertical array, can be programmed to store data by the way of its state at a voltage applied across the memory cell. For example, if a memory cell is configured or programmed in such a state that allows a substantial current to pass the memory cell at a voltage in a predefined voltage region, the memory cell is considered to have been configured or programmed to store a first bit value (e.g., one or zero); and otherwise, the memory cell is storing a second bit value (e.g., zero or one).

Optionally, a memory cell can be configured or programmed to store more than one bit of data by being configured or programmed, for example, to have a threshold voltage in one of more than two separate voltage regions.

The threshold voltage of a memory cell is such that when the voltage applied across the memory cell is increased to above the threshold voltage, the memory cell changes rapidly or abruptly, snaps (e.g., for a chalcogenide memory cell), or jumps from a non-conductive state to a conductive state. The non-conductive state allows a small leak current to go through the memory cell; and in contrast, the conductive state allows more than a threshold amount of current to go through. Thus, a memory device can use a sensor to detect the change, or determine the conductive/non-conductive state of the memory device at one or more applied voltages, to evaluate or classify the level of the threshold voltage of the memory cell and thus its stored data.

The threshold voltage of a memory cell being configured/programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in Quad-Level Cell (QLC) mode.

The threshold voltage of a memory cell can change or drift over a period of time, usage, and/or read operations, and in response to certain environmental factors, such as temperate changes. The rate of change or drift can increase as the memory cell ages. The change or drift can result in errors in determining, retrieving, or reading the data item back from the memory cell.

Random errors in reading memory cells can be detected and corrected using redundant information. Data to be stored into memory cells can be encoded to include redundant information to facilitate error detection and recovery. When data encoded with redundant information is stored in a memory sub-system, the memory sub-system can detect errors in data represented by the voltage regions of the threshold voltages of the memory cells and/or recover the original data that is used to generate the data used to program the threshold voltages of the memory cells. The recovery operation can be successful (or have a high probability of success) when the data represented by the threshold voltages of the memory cells (and thus retrieved directly from the memory cells) in the memory sub-system contains fewer errors, or the bit error rate in the retrieved data is low and/or when the amount of redundant information is high. For example, error detection and data recovery can be performed using techniques such as Error Correction Code (ECC), Low-Density Parity-Check (LDPC) code, etc.

When the data retrieved from the memory cells of the memory sub-system has too many errors for successful decoding, the memory sub-system may retry the execution of the read command. Voltage pulses applied during read retry can cause threshold voltages previously programmed into separate regions to move closer to each other and into a common region and thus reduce the readability of memory cells.

Read retry is sometimes used in memory operation systems to perform a re-read operation on a target codeword (CW), with the goal of achieving various benefits including error correction, re-programming, etc. In one example, for chalcogenide memory cells in a cross-point array, read retry with high read voltages (e.g., VDMs) sometimes causes refreshing of the SET bits, with the RESET (or simply "RST") bits remaining un-snapped. In another example, applying random polarity reads (e.g., applying read in either negative or positive polarity randomly or iteratively) on a bipolar-type memory array (e.g., using chalcogenide memory cells) sometimes causes continuous refreshing of bits during reads.

In some cases, a read retry may be triggered directly after determining that fails from reading a codeword are beyond an ECC tolerance (e.g., a tolerance threshold). In one example of a codeword (CW) read from a chalcogenide memory array, if a memory device is implementing bipolar read, bits of different states can have been affected by different drift times following prior programming of the bits.

Repeated reading of memory cells can cause various technical problems. In one example, for a bipolar-operated memory array (e.g., planar or vertically-integrated cross-point memory arrays), a so-called "imprint" effect results from repeated unipolar snapping by read operations on memory cells in the memory array (e.g., repeated reads on chalcogenide memory cells that are in a SET or low threshold voltage state). The repeated reads result in segregation of electrical states in the memory cells. This degrades the ability to reset the memory cells (e.g., by performing a RESET on SET write operation). In one example, continuous read snapping on memory cell bits can result in the problems associated with the imprint effect. The resulting cell segregations degrades the reset ability of the memory cells in a subsequent write operation to program cells to a reset (RST) state. In one example, the imprint effect causes the E3 edge of the RESET threshold voltage distribution for the memory cells to be too low.

The degradation of reset (RST) margin by the imprint of so-called "read disturb on SET" (RDS) can be severe. For example, the degradation can be severe even with only about 100 RDS read counts. Further, it is difficult to predict an extent of any such read disturb problem using, for example, read outs (RO) from memory cells in a SET state.

In one approach, the reset write pulse (e.g., RST programming pulse) can be made stronger for write operations (e.g., higher selection spike, higher pulse amplitude, etc.). As the reset write pulse gets stronger, this may help drag the segregated status of the cells back closer to their original state to try to reduce the RDS imprint degradation on the RST side. However, stronger write pulses are more destructive to the memory cells and speed up the rate at which the memory cells are worn out and no longer useable. So, using the strong reset write pulse all the time causes the lifetime of the memory array to degrade significantly.

In some approaches, toggled writes or additional reset (RST) refreshes can be used when doing a reset operation. However, these steps are difficult to properly trigger. For example, it is not clear when they are needed (e.g., too few read counts for triggering, no obvious degradation signals before reset (RST), etc.). Also, these steps consume a lot of energy due to using the extra writes.

Also, using stronger write pulses (e.g., RST pulses) all the time (for all reset write operations) is not necessary when the imprint risk (due to read disturb on SET (RDS)) is low or not of practical concern. Further, this causes much faster write endurance degradation on the memory array.

To address these and other technical problems, in various embodiments a dynamic approach is used so that stronger reset pulses (e.g., RESET on SET write pulses for chalcogenide cells) are only triggered when there is an increased risk of the imprint effect. For example, memory cells touched by a relatively higher number of read operations have a higher risk than memory cells touched by a relatively lower number of read operations.

In one embodiment, a controller of a memory device dynamically selects whether to use either a regular write pulse(s) or an enhanced write pulse(s) (e.g., as commands are received from a host device). In one example, the enhanced write pulse is implemented by increasing a write voltage. In one example, the enhanced write pulse is implemented by varying a current through one or more memory cells so that the imprint effect is reduced.

In one embodiment, a controller searches a lookup table to determine whether to selectively enhance a write pulse (e.g., by voltage and/or current enhancement). In one example, the enhanced write pulse is implemented by increasing the current (e.g., a spike current) through each memory cell (e.g., as part of a RESET write operation). In one example, the current can be increased even if bitline and wordline voltages are held constant. In one example, both the write voltage and the cell current are increased. Other variations of voltage and current are possible.

In one embodiment, one or more memory cells are configured in a circuit so that a controller is able to vary the current running through each cell (e.g., at least the transient/spike current through the cell when it snaps). In some cases, the current can be varied without changing the bitline and/or wordline voltage used to select the cell. In one example, there is a separate transistor in the write path/circuit of the memory cell for which the gate voltage is changed to control (e.g., increase or decrease, or limit) the spike current through the cell. In one example, bias circuitry and/or the controller controls the gate voltage during a write operation (e.g., based on feedback from sensing circuitry).

In one embodiment, memory cells or bits having a higher imprint risk are recorded by a controller of a memory device (e.g., by updating a lookup table). The controller searches the lookup table when a reset on set (RESET on SET) write operation is to be performed. If the target bits or codeword (CW) of the write operation are in the lookup table, then the magnitude of the write pulse (e.g., one or more pulses can be used) is increased (e.g., a write voltage is enhanced or made stronger by 0.5 to 2 volts, and/or a spike current through the memory cell is controlled to have a larger magnitude). Otherwise, a normal write pulse is used.

In one embodiment, possible risky bits or codewords (CWs) are recorded in a lookup table during conventional read operations. In one example, a probabilistic approach is used in which bits or codewords being read in a read operation are randomly selected for inclusion in the lookup table. In one example, for every fixed number (e.g., 100) or read operations performed by a controller, one of the read operations is randomly selected. The address for the selected read operation is added to the lookup table (LUT). This is repeated for each subsequent 100 read operations so that the lookup table is built up to typically contain risky bits or codewords.

When the controller is performing a RESET on SET write operation for an address location (corresponding to bits or a codeword), the controller searches the lookup table to see if the address is found. In one embodiment, if the address location is in the lookup table, the controller selects a stronger RESET write pulse to use. For example, the stronger RESET write voltage is of a greater magnitude than normal RESET write voltage(s) used for memory cells of expected lower imprint risk. In one example, the controller determines that a RESET on SET write operation will be performed based on normal write pre-read feedbacks. After performing the RESET on SET write operation, the corresponding address (bits/codeword) is removed from the lookup table.

Stronger RESET pulses (e.g., with a bigger RESET spike) can help to mitigate the read disturb on SET imprint effect, and reduce RESET threshold voltage (Vth) degradation. In one example, the triggering of RESET pulse enhancement is done based on probabilistic read disturb handling, which tracks the read workload with one or more functions added on the controller.

In one embodiment, a memory device has a vertical cross-point memory array that includes chalcogenide memory cells. The memory device has bias circuitry to apply voltages (e.g., used as part of applying write pulses) to the memory cells when performing read and write operations. In one example, for the write operations the voltages include a normal write voltage, and an enhanced write voltage of a greater magnitude than the first write voltage. In one embodiment, the bias circuitry also further controls spike current mitigation circuitry (e.g., by varying a gate voltage of a CMOS transistor in series with the memory cell) that controls a magnitude of a spike current through the memory cell(s). In one example, for a normal write operation the spike current is controlled to a first magnitude, and for a write operation using an enhanced write pulse the spike current is controlled to have a second magnitude that is greater than the first magnitude.

The memory device includes memory that stores a lookup table (or other form of record to store address data) associated with prior read operations for the memory cells. A controller of the memory device performs read operations on memory cells of the memory array. When performing each read operation, the controller determines whether to add an entry to the lookup table. For example, the foregoing builds up a lookup table of addresses of codewords in the memory array.

Later, the controller performs a write operation on one or more memory cells. The controller determines a write pulse (e.g., write voltage or spike current limit) to select based in part on the lookup table. Specifically, the controller searches the lookup table to see if the address for the write operation corresponds to an entry in the lookup table. If the address is in the lookup table, the controller selects the enhanced write pulse. If the address is not in the lookup table, the controller selects the normal write pulse. The controller then applies the selected write pulse to the memory cells as part of performing the write operation.

Various advantages are provided by at least some embodiments described herein. In one example, the E3 edge threshold voltage (Vth) degradation caused by read disturb on SET (RDS) imprint is mitigated by using a stronger write pulse selectively (e.g., only when needed based on a characteristic of prior read operations). Using this selective approach, there is less degradation of the write endurance capability of the memory array.

FIG. 1 shows a memory device 101 having a memory controller 120 that determines whether to enhance a write pulse (e.g., write voltage) by searching a lookup table 180 associated with prior read operations on memory cells 110, 112 of a memory array 102, in accordance with some embodiments.

Memory device 101 has a memory controller 120 that selects pulses (e.g., voltages and/or currents) for read and write operations. In one embodiment, controller 120 uses a read count(s) stored in one or more of counters 104 to determine addresses associated with read operations to add to lookup table 180.

In one embodiment, controller 120 uses random numbers generated by random number generator 182 for probabilistically identifying only a portion of read operations for which associated addresses are added to lookup table 180. This helps maintain lookup table 180 at a smaller size.

Memory controller 120 includes one or more processing devices 116 and memory 118 (e.g., non-volatile flash memory). Lookup table 180 is stored, for example, in memory 118. In one example, memory 118 also stores firmware executed by processing device 116 to apply pre-read and/or write voltages.

Memory controller 120 can use bias circuitry 124 to generate voltages for applying pre-read, read, write and other voltages (e.g., initial read and read retry). Bias circuitry 124 generates voltages for applying write voltages to memory cells 110, 112 as part of programming operations. Bias circuitry 124 generates read voltages for read operations performed on memory array 102 (e.g., in response to a read command from host device 126).

Memory device 101 includes sensing circuitry 122, which is used to sense a state of each memory cell in memory array 102. In one example, sensing circuitry 122 includes sense amplifiers used to detect a current caused by applying various voltages to memory cells in memory array 102. In one example, bias circuitry 124 applies a pre-read voltage to memory cells 110. Sensing circuitry 122 senses a current associated with each of the memory cells 110 caused by applying the pre-read voltage.

In one example, if sensing circuitry 122 determines that the current for a memory cell is greater than a fixed threshold (e.g., a predetermined level of current), then memory controller 120 determines that the memory cell has snapped.

In one embodiment, memory cells 110 and memory cells 112 correspond to different memory types (e.g., single level cell, or multi-level cell). In one example, the material used to form a select device of each memory cell is different.

In one embodiment, memory controller 120 receives a write command from host device 126. The write command is accompanied by data (e.g., user data of a user of host device 126) to be written to memory array 102 at an address associated with the write command (e.g., sent by host device 126 with the write command). In response to receiving the write command, controller 120 initiates a programming operation.

In one embodiment, controller 120 uses one of counters 104 to count the number of memory cells that snap as a pre-read voltage is applied. Data stored in counters 104 can be used to select a write pulse (e.g., voltage) for performing a write operation.

In one embodiment, controller 120 may use write pulses (e.g., write voltages) to write a logic state to a memory cell, such as memory cell 110, 112 during a write operation. The write pulses may be applied by providing a first voltage to a bit line and providing a second voltage to a word line to select the memory cell. Circuits coupled to access lines to which memory cells may be coupled may be used to provide the write voltages (e.g., access line drivers included in decoder circuits). The circuits may be controlled by internal control signals provided by a control logic (e.g., controller 120). The resulting voltage applied to the memory cell is the difference between the first and second voltages. The write pulses may be the same duration as read pulses in some embodiments. In some embodiments the duration is 10-50 ns. In some embodiments, the duration is 1-100 ns. In some embodiments, the duration is 1 ns to 1 microsecond. Writing to the memory cell may take the same time as reading the memory cell in some embodiments.

In one example, the polarity of the read or write pulses may be either a first polarity or a second polarity. For example, a write pulse may apply a voltage to a memory cell in a first polarity (e.g., bit line at 6V and word line at 0V).

In one example, circuits coupled to access lines to which memory cells may be coupled are used to provide read pulses (e.g., access line drivers included in decoder circuits). The circuits may be controlled by internal control signals provided by a control logic (e.g., controller 120). A read voltage or pulse may be a voltage applied to a memory cell for a period of time (e.g., 10-50 ns, 1-100 ns, 1 ns to 1 microsecond). In some embodiments, the read pulse may be a square pulse. In some embodiments, the read pulse may be a ramp, that is, a linearly-increasing voltage may be applied across the memory cell.

In one example, after being accessed (e.g., selected), a memory cell may be read, or sensed, by a sense component (e.g., sensing circuitry 122) to determine the stored state of the memory cell. For example, a voltage may be applied to the memory cell (using a word line and bit line) and the presence of a resulting current may depend on the applied voltage and the threshold voltage of the memory cell. In some cases, more than one voltage may be applied. Additionally, if an applied voltage does not result in current flow, other voltages may be applied until a current is detected by the sense component. By assessing the voltage that resulted in current flow, the stored logic state of the memory cell may be determined. In some cases, the voltage may be ramped up in magnitude until a current flow is detected (e.g., a memory cell turns on, switches on, conducts current, or becomes activated). In other cases, predetermined voltages may be applied sequentially until a current is detected. Likewise, a current may be applied to a memory cell, and the magnitude of the voltage to create the current may depend on the electrical resistance or the threshold voltage of the memory cell.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

The sense component may include various transistors or amplifiers in order to detect and amplify a difference in the signals. The detected logic state of the memory cell may then be output through a column decoder as output. In some cases, the sense component may be part of a column decoder or a row decoder.

In one embodiment, controller 120 receives a command from host device 126. Controller 120 determines whether the command is a read command or write command.

In response to determining that the command is a read command, controller 120 initiates a read operation to read data stored at an address associated with the command. The address is received from host device 126 (or can be generated by controller 120) in response to receiving the read command.

In response to receiving the read command, controller 120 makes a determination whether the received address should be added to lookup table 180. In one embodiment, controller 120 evaluates one or more characteristics associated with the read command. In one example, the characteristic is a read count. Controller 120 determines whether the read count corresponds to a read operation for which the associated address is to be added to lookup table 180. In one example, the read count increments by one for each read command received from host device 126.

In another embodiment, the characteristic is data associated with an expected risk of the imprint effect. In one example, the data is collected by sensors (e.g., temperature) of memory array 102 and/or received from host device 126.

In one example, controller 120 determines that the read count matches a random number generated by random number generator 182. In one example, the random number generated is a uniform random number (URN). In response to determining the match, controller 120 adds the address of the read operation to lookup table 180. If there is no match, then the address is not added to lookup table 180.

In one example, the random number has been generated for a window having a size set to a fixed number (e.g., a number W selected by host device 126) of read operations. In other words, a single random number is generated for each of successive windows, each window having the fixed number of read operations (e.g., 100 read operations for a first window, 100 read operations for a second, etc.).

In response to determining that the command is a write command, controller 120 initiates a write operation. The write operation is to write data at an address received from host device 126. As part of the write operation, controller 120 determines whether to increase one or more write voltages and/or currents associated with the write operation.

To make this determination, controller 120 searches lookup table 180. If the address is not in lookup table 180, then controller 120 uses a normal write pulse. In other words, the write pulse is not enhanced or made stronger.

If the address is found in lookup table 180, then controller 120 determines a type of the write operation. If the controller 120 determines that the type of write operation is a reset operation, then controller 120 increases the write pulse used for programming memory cells at the address. In one example, the type of write operation is determined to be a RESET on SET write operation. After the memory cells are programmed using the increased write pulse, then the address corresponding to the memory cells is removed from lookup table 180.

If the controller 120 determines that the type of write operation is not a reset operation (e.g., determines the type is a set operation such as SET on RESET), then controller 120 uses a normal write pulse(s) (e.g., the write voltage is not enhanced or made stronger as described above for a RESET on SET operation).

In one embodiment, as read commands are received from host device 126, lookup table 180 increases in size (e.g., the amount of data stored increases). Controller 120 monitors the size of lookup table 180 to determine an extent that the storage capacity of lookup table 180 has been filled. When controller 120 determines that the extent of data stored has reached a threshold (e.g., the lookup table is full or 90% full), controller 120 performs a refresh operation for memory cells corresponding to one or more addresses in lookup table 180. After the memory cells are refreshed, the corresponding addresses are removed from lookup table 180 to increase availability of storage for new address entries as new read commands are received from host device 126.

In one example, controller 120 selects the addresses above for removal that are stored in lookup table 180 multiple times (e.g., two times). In one example, controller 120 uses a first-in, first-out (FIFO) approach in which the earliest one or more addresses added to lookup table 180 are removed. One or both approaches can be used.

In one example, the refresh operation above is a toggled refresh. In one example, the toggled refresh uses a reset operation followed by set operation on memory cells in a set state (e.g., a RESET pulse and a SET pulse are applied to SET bits of a codeword).

Figure 2:
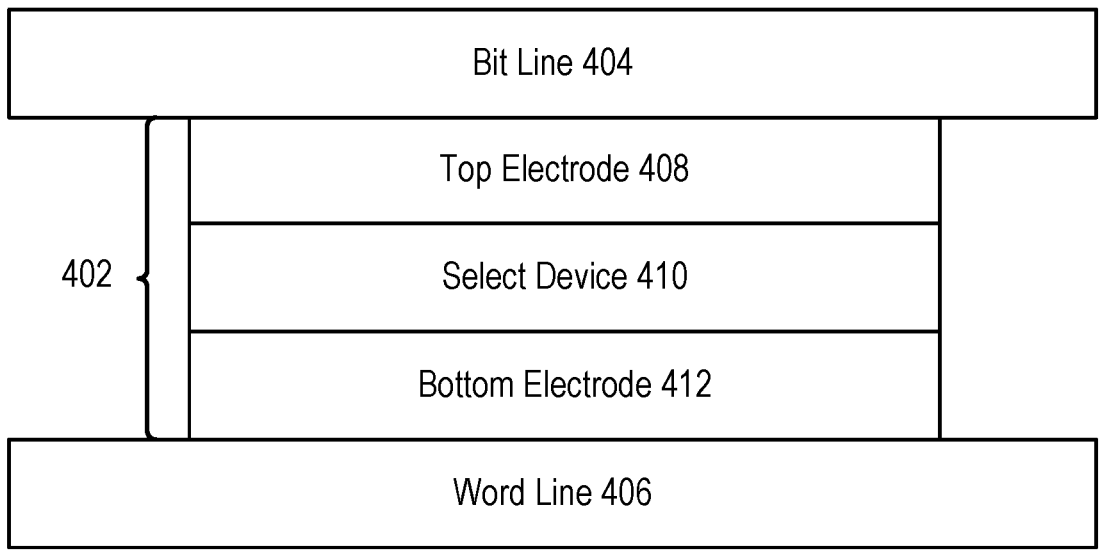
FIG. 2 shows an example of a memory cell that includes a select device, in accordance with some embodiments.

FIG. 2 shows an example of a memory cell 402 that includes a select device 410, in accordance with some embodiments. In one example, select device 410 includes a chalcogenide. Memory cell 402 is an example of memory cells 110, 112.

Top electrode 408 conductively connects select device 410 to bit line 404, and bottom electrode 412 conductively connects select device 410 to word line 406. In one example, electrodes 408, 412 are formed of a carbon material.

In one example, select device 410 includes a chalcogenide (e.g., chalcogenide material and/or chalcogenide alloy). Threshold voltage properties of the select device may be based on the voltage polarities applied to the memory cell.

In one example, a logic state may be written to memory cell 402, which may correspond to one or more bits of data. A logic state may be read from or written to the memory cell by applying voltages of different polarities at different voltage and/or current magnitudes. The reading and writing protocols may take advantage of different threshold voltages of the select device that result from the different polarities.

Figure 3:
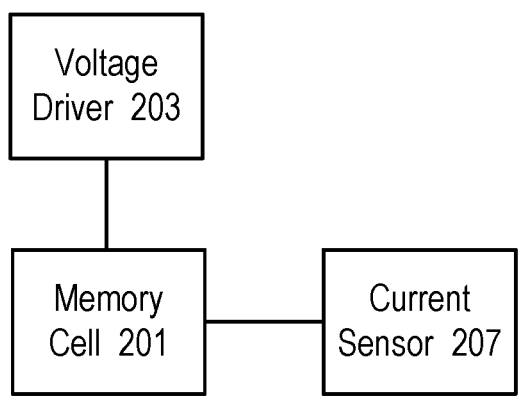
FIG. 3 shows a voltage driver that drives a voltage profile applied to a memory cell, in accordance with some embodiments.

FIG. 3 shows a voltage driver 203 that drives a voltage profile applied to a memory cell 201, in accordance with some embodiments. Voltage driver 203 is configured to drive up the voltage applied on the memory cell 201 for pre-read and programming that are done during a write operation. In one embodiment, voltage driver 203 is implemented by multiple voltage drivers. In one example, a portion of the voltage drivers are bit line drivers, and another portion of the voltage drivers are word line drivers. Voltage drivers 203 are an example of bias circuitry 124. Memory cell 201 is an example of memory cell 110, 112.

When a sensing voltage is applied to memory cell 201, current sensor 207 determines a current resulting from applying the sensing voltage. In one example, voltage drivers 203 apply the sensing voltage by driving a bit line to a positive voltage, and a word line to a negative voltage. Voltage drivers 203 can similarly apply a pre-read voltage to memory cell 201. Current sensor 207 is an example of sensing circuitry 122.

In one embodiment, a pre-read voltage is applied to determine the existing state of a memory cell, so that a type of write operation can be selected and used. After applying the pre-read voltage, when the voltage applied on the memory cell 201 is above the threshold voltage of a programmed cell, the current sensor 207 is configured to determine whether or not the memory cell 201 is conductive, based on the current going through the memory cell 201. If the current sensor 207 detects an amount of current corresponding to a programmed cell, the memory cell 201 is determined to have been programmed to be a SET cell to have a low threshold voltage (corresponding to data that is different from the data represented by a RESET cell that has a high voltage threshold). If the current sensor 207 does not detect the amount of current corresponding to a programmed cell, the memory cell is determined to be a reset cell that corresponds to predetermined data represented by having high voltage thresholds (e.g., cells that have not yet been programmed after a reset or erase operation, or cells that have been programmed to have a high threshold voltage).

Figure 4:
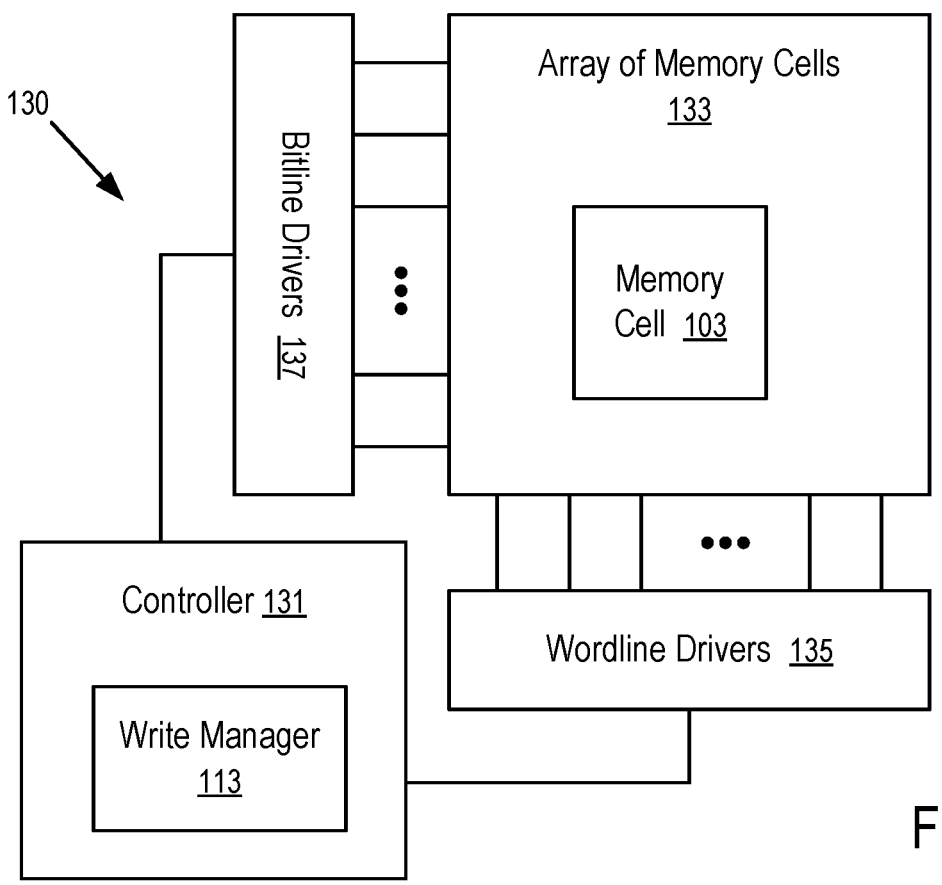
FIG. 4 shows a memory device configured with a write manager, according to one embodiment.

FIG. 4 shows a memory device 130 configured with a write manager 113, according to one embodiment. Memory device 130 is an example of memory device 101. In FIG. 4, the memory device 130 includes an array 133 of memory cells, such as a memory cell 103. In one example, an array 133 can be referred to as a tile; and a memory device (e.g., 130) can have one or more tiles. Different tiles can be operated in parallel in a memory device (e.g., 130).

For example, the memory device 130 illustrated in FIG. 4 can have a cross-point memory having at least the array 133 of memory cells (e.g., 103). In another example, the memory device 130 illustrated in FIG. 4 can have a 3D vertical architecture having at least the array 133 of memory cells (e.g., 103).

In some implementations, the cross-point memory uses a memory cell 103 that has an element (e.g., a sole element) acting both as a selector device and a memory device. For example, the memory cell 103 can use a single piece of alloy with variable threshold capability. The read/write operations of such a memory cell 103 can be based on thresholding the memory cell 103 while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

Figure 5:
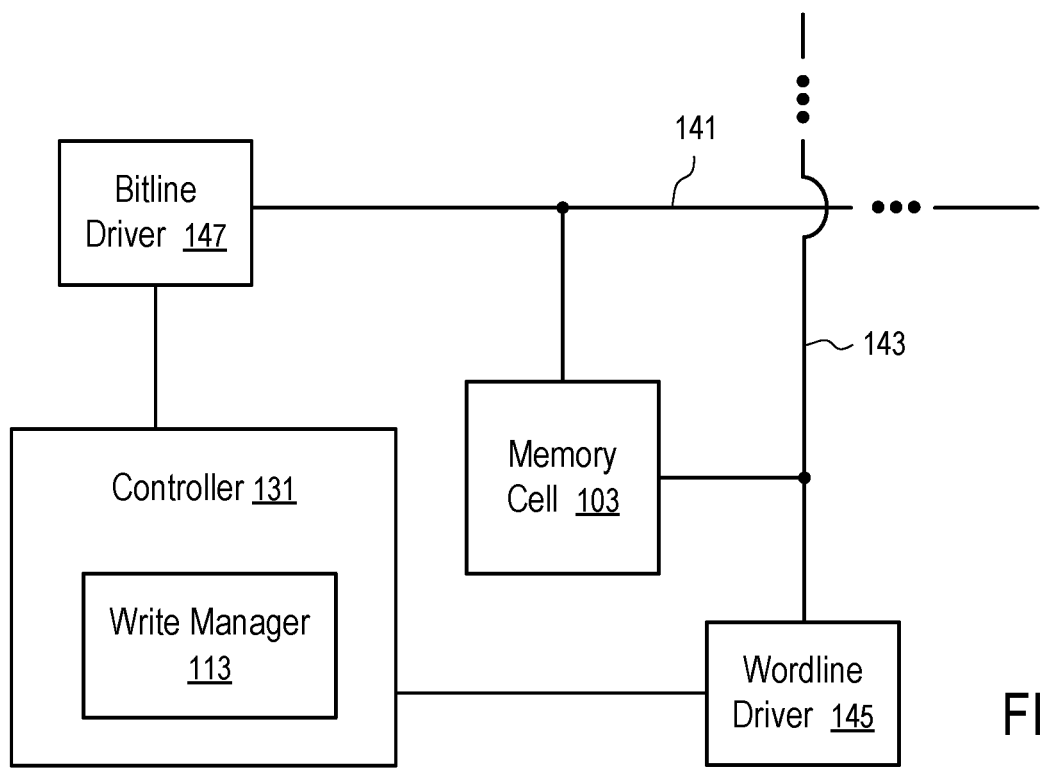
FIG. 5 shows a memory cell with a bitline driver and a wordline driver configured to apply voltage pulses, according to one embodiment.

The memory device 130 of FIG. 4 includes a controller 131 that operates bitline drivers 137 and wordline drivers 135 to access the individual memory cells (e.g., 103) in the array 133. For example, each memory cell (e.g., 103) in the array 133 can be accessed via voltages driven by a pair of a bitline driver 147 and a wordline driver 145, as illustrated in FIG. 5. Controller 131 is an example of controller 120.

The controller 131 includes a write manager 113 configured to determine whether to enhance a write pulse (e.g., voltage) (e.g., based on lookup table 180) when writing memory cells. The write manager 113 can be implemented, for example, via logic circuits and/or microcodes/instructions. For example, during a write operation, the write manager 113 uses an enhanced write voltage having a magnitude larger than a normal write voltage.

FIG. 5 shows a memory cell 103 with a bitline driver 147 and a wordline driver 145 configured to apply voltage pulses, according to one embodiment. For example, the memory cell 103 can be a typical memory cell 103 in the memory cell array 133 of FIG. 4.

The bitline driver 147 and the wordline driver 145 of FIG. 5 are controlled by the write manager 113 of the controller 131 to selectively apply one or more pulses (e.g., voltage pulses) to the memory cell 103. The bitline driver 147 and the wordline driver 145 can apply voltages of different polarities on the memory cell 103.

For example, in applying one polarity of voltage (e.g., positive polarity), the bitline driver 147 drives a positive voltage relative to ground on a bitline 141 connected to a row of memory cells in the array 133; and the wordline driver 145 drives a negative voltage relative to ground on a wordline 143 connected to a column of memory cells in the array 133.

In applying the opposite polarity of voltage (e.g., negative polarity), the bitline driver 147 drives a negative voltage on the bitline 141; and the wordline driver 145 drives a positive voltage on the wordline 143.

The memory cell 103 is in both the row connected to the bitline 141 and the column connected to the wordline 143. Thus, the memory cell 103 is subjected to the voltage difference between the voltage driven by the bitline driver 147 on the bitline 141 and the voltage driven by the wordline driver 145 on the wordline 143.

In general, when the voltage driven by the bitline driver 147 is higher than the voltage driven by the wordline driver 145, the memory cell 103 is subjected to a voltage in one polarity (e.g., positive polarity); and when the voltage driven by the bitline driver 147 is lower than the voltage driven by the wordline driver 145, the memory cell 103 is subjected to a voltage in the opposite polarity (e.g., negative polarity).

In some implementations, the memory cell 103 is a self-selecting memory cell implemented using a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (Cl), or fluorine (F), each in atomic or molecular forms.

The selector/memory device has a top side and a bottom side. A top electrode is formed on the top side of the selector/memory device for connecting to a bitline 141; and a bottom electrode is formed on the bottom side of the selector/memory device for connecting to a wordline 143. For example, the top and bottom electrodes can be formed of a carbon material. For example, a chalcogenide material of the memory cell 103 can take the form of a crystalline atomic configuration or an amorphous atomic configuration. The threshold voltage of the memory cell 103 can be dependent on the ratio of the material in the crystalline configuration and the material of the amorphous configuration in the memory cell 103. The ratio can change under various conditions (e.g., having currents of different magnitudes and directions going through the memory cell 103).

A self-selecting memory cell 103, having a selector/memory device, can be programmed to have a threshold voltage window. The threshold voltage window can be created by applying programming pulses with opposite polarity to the selector/memory device. For example, the memory cell 103 can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a programmed cell to snap and thus become conductive while a reset cell remains non-conductive.

For example, to program the voltage threshold of the memory cell 103, the bitline driver 147 and the wordline driver 145 can drive a pulse of voltage onto the memory cell 103 in one polarity (e.g., positive polarity) to snap the memory cell 103 such that the memory cell 103 is in a conductive state. While the memory cell 103 is conductive, the bitline driver 147 and the wordline driver 145 continue driving the programming pulse to change the threshold voltage of the memory cell 103 towards a voltage region that represents the data or bit value(s) to be stored in the memory cell 103.

The controller 131 can be configured in an integrated circuit having a plurality of decks of memory cells. Each deck can be sandwiched between a layer of bitlines, a layer of wordlines; and the memory cells in the deck can be arranged in an array 133. A deck can have one or more arrays or tiles. Adjacent decks of memory cells may share a layer of bitlines (e.g., 141) or a layer of wordlines (e.g., 143). Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers 137 are connected to bitlines in the decks; and wordline drivers 135 are connected to wordlines in the decks. Thus, a typical memory cell 103 is connected to a bitline driver 147 and a wordline driver 145.

The threshold voltage of a typically memory cell 103 is configured to be sufficiently high such that when only one of its bitline driver 147 and wordline driver 145 drives a voltage in either polarity while the other voltage driver holds the respective line to the ground, the magnitude of the voltage applied across the memory cell 103 is insufficient to cause the memory cell 103 to become conductive. Thus, addressing the memory cell 103 can be performed via both of its bitline driver 147 and wordline driver 145 driving a voltage in opposite polarity relative to the ground for operating/selecting the memory cell 103. Other memory cells connected to the same wordline driver 145 can be de-selected by their respective bitline drivers holding the respective bitlines to the ground; and other memory cells connected to the same bitline driver can be de-selected by their respective wordline drives holding the respective wordlines to the ground.

A group of memory cells (e.g., 103) connected to a common wordline driver 145 can be selected for parallel operation by their respective bitline drivers (e.g., 147) driving up the magnitude of voltages in one polarity while the wordline driver 145 is also driving up the magnitude of a voltage in the opposite polarity. Similarly, a group of memory cells connected to a common bitline driver 147 can be selected for parallel operation by their respective wordline drivers (e.g., 145) driving voltages in one polarity while the bitline driver 147 is also driving a voltage in the opposite polarity.

At least some examples are disclosed herein in reference to a cross-point memory having self-selecting memory cells. Other types of memory cells and/or memory can also be used. For example, memory cells each having a selector device and a phase-change memory device and/or flash memory cells can also be used in at least some embodiments. Additionally or alternatively, the memory can have a different architecture, such as a 3D vertical architecture.

Figure 6:
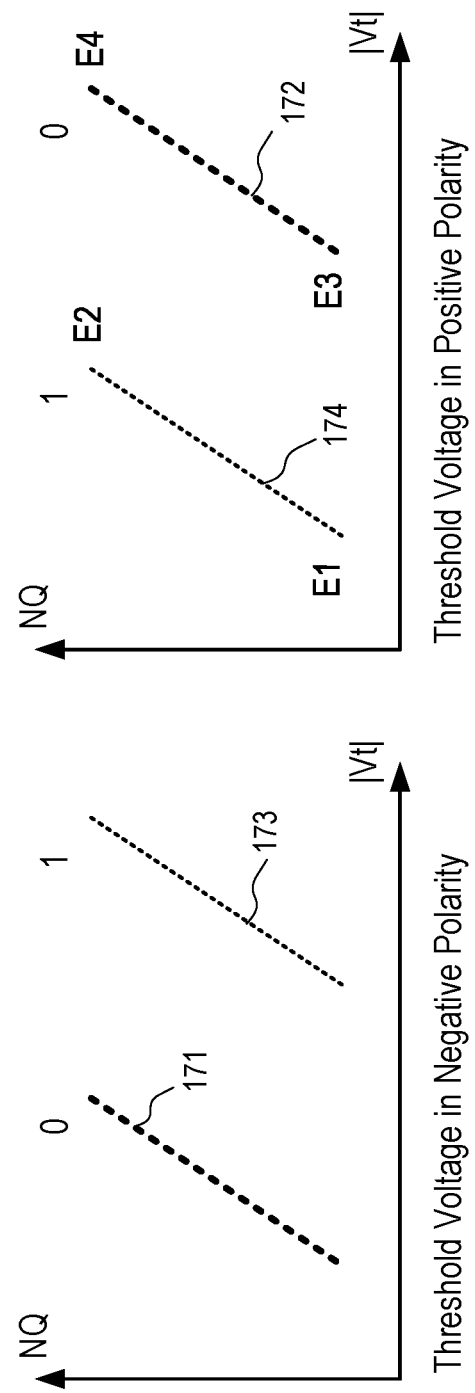
FIG. 6 shows an exemplary normal quantile (NQ) plot representing the statistical distributions of threshold voltages of memory cells.

FIG. 6 shows an exemplary normal quantile (NQ) plot representing the statistical distributions (e.g., 171-174) of threshold voltages of memory cells. In one example, the memory cells are memory cells 110, 112, or 103. When a probability distribution (e.g., 171) of threshold voltages programmed in a region is a normal distribution (also known as Gaussian distribution), its normal quantile (NQ) plot is seen as aligned on a straight line (e.g., distribution 171).

A self-selecting memory cell (e.g., 103) can have a threshold voltage in negative polarity and a threshold voltage in positive polarity. When a voltage applied on the memory cell 103 in either polarity is increased in magnitude up to its threshold voltage in the corresponding polarity, the memory cell (e.g., 103) snaps from a non-conductive state to a conductive state.

The threshold voltage of a memory cell 103 in negative polarity and the threshold voltage of the memory cell 103 in positive polarity can have different magnitudes. Memory cells programmed to have large magnitudes in threshold voltages in positive polarity can have small magnitudes in threshold voltages in negative polarity; and memory cells programmed to have small magnitudes in threshold voltages in positive polarity can have large magnitudes in threshold voltages in negative polarity.

For example, a memory cell can be programmed to have a small magnitude in threshold voltage according to distribution 174 in the positive polarity to represent a value (e.g., one); and as a result, its threshold voltage has a large magnitude according to distribution 173 in the negative polarity to represent the same value (e.g., one). Alternatively, the memory cell can be programmed to have a large magnitude in threshold voltage according to distribution 172 in the positive polarity to represent another value (e.g., zero); and as a result, its threshold voltage has a smaller magnitude according to distribution 171 in the negative polarity to represent the same value (e.g., zero).

Thus, to determine whether a memory cell 103 is storing the one value (e.g., one) or the other value (e.g., zero), a controller can read the memory cell 103 in either the positive polarity or the negative polarity. If the threshold voltage of the memory cell 103 has a large magnitude according to distribution 172 in the positive polarity, it stores the other value (e.g., zero); otherwise, it stores the one value (e.g., one). Similarly, if the threshold voltage of the memory cell 103 has a large magnitude according to distribution 173 in the negative polarity, it stores the one value (e.g., one); otherwise, it stores the other value (e.g., zero).

For purposes of illustration, the so-called E1, E2, E3, and E4 edges of the distributions 172, 174 are indicated in FIG. 6. For example, the E3 edge of distribution 172 corresponds to the E3 edge of the reset (e.g., RESET) distribution.

The threshold voltage distributions of memory cells may change after a read. For example, in the positive polarity, a read can cause the high magnitude distribution 172 to shift downward, and/or the low magnitude distribution 174 to shift downward.

Similarly, in negative polarity, the read can cause the high magnitude distribution 173 to shift downward, and/or the low magnitude distribution 171 to shift downward.

Figure 7:
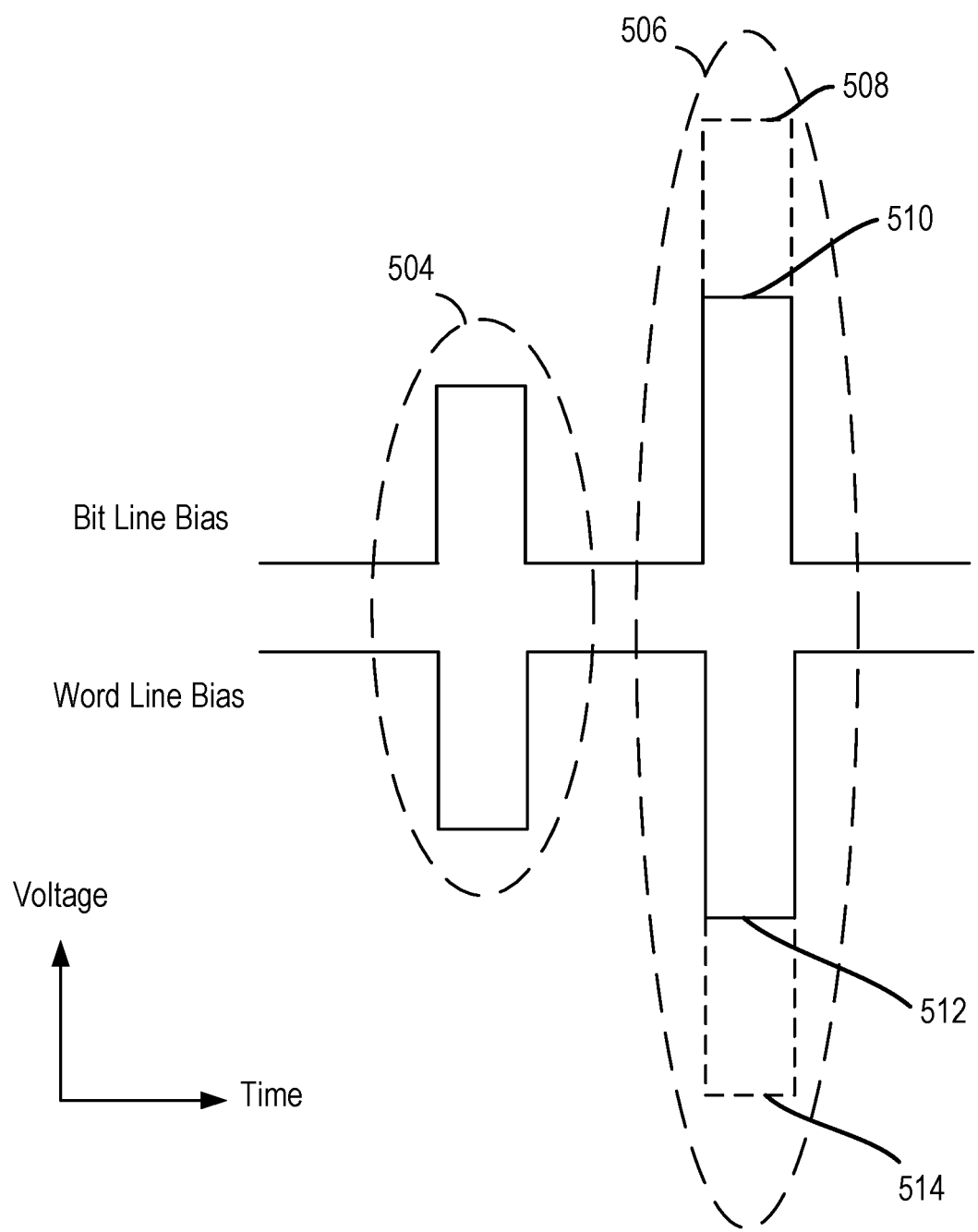
FIG. 7 shows exemplary voltage pulses applied to a memory cell, in accordance with some embodiments.

FIG. 7 shows exemplary voltage pulses applied to a memory cell, in accordance with some embodiments. In one example, the voltage pulses are applied to memory cell 110, 112 of memory array 102. In one example, the voltage pulses are generated by bias circuitry 124. In one example, the voltage pulses are driven by voltage driver 203.

In one embodiment, the voltage pulses include a pre-read voltage 504 and a write voltage 506. The write voltage 506 can be, for example, a first write voltage or a second write voltage (e.g., as selected by a controller or voltage driver). The first write voltage is a default or normal write voltage. The first write voltage is applied using a bit line bias 510 and a word line bias 512. The second write voltage is an enhanced write voltage. The second write voltage is applied using a bit line bias 508 and word line bias 514, so that the overall voltage applied to the memory cell has a greater magnitude.

In one embodiment, a controller selects the first write voltage or the second write voltage based on feedback from applying pre-read voltage 504 to the memory cell. In one embodiment, the feedback is provided by a current sensor. In one example, the current sensor is current sensor 207.

In one embodiment, the controller applies, as part of the write operation, a pre-read voltage 504 to at least one first memory cell of a codeword. The controller determines whether a write operation is of the type (e.g., a RESET on SET write) that increases the magnitude of the threshold voltage based at least in part on applying the pre-read voltage 504. The pre-read voltage 504 is applied to determine an existing state of the first memory cell. The determination whether the write operation is of the type that increases the magnitude of the threshold voltage includes comparing the existing state to a target state for the first memory cell. This determination of the type of write operation and the results from searching, for example, lookup table 180 are used to select a write voltage (e.g., normal default voltage(s), or voltage(s) of increased magnitude).

In one embodiment, a voltage driver selects the first write voltage or the second write voltage based on pre-read feedback. In one example, the voltage driver is voltage driver 203. In one example, the voltage driver is bit line driver 137 and/or word line driver 135. In one example, the voltage driver is implemented in CMOS circuitry underneath a stacked memory array.

In one example, the bit line bias in FIG. 7 is applied by bias circuitry 124. In one example, the word line bias in FIG. 7 is applied by bias circuitry 124.

In one embodiment, write voltage 506 is a series of voltage pulses applied to change the voltage of a memory cell. In one example, SET/RESET write pulses are used to crystallize/amorphize the memory cell. In one example, the SET/RESET write pulses are used to snap the cell in different polarities for creating different polarization states.

In one example, a SET on RESET write operation is performed using the series of voltage pulses in FIG. 7, which changes the state of the voltage threshold of the memory cell from high (representing "RESET" having bit value of 0) to low (representing "SET" to have a bit value of 1).

In one example, a RESET on SET write operation is performed using the series of voltage pulses in FIG. 7, which causes an opposite change in which the voltage threshold is moved from low (representing "SET" or 1) to high (representing "RESET" or 0).

In one example, other cases may include a RESET on RESET write operation and a SET on SET write operation. In these two cases, there is no significant change to the state of the voltage threshold of the memory cell. The write pulse may not be used.

In one example, once a memory cell snaps, the current going through the memory cell jumps to a high level; and a high voltage on the memory cell cannot be sustained. The voltage on the memory cell drops (snaps). Once the memory cell snaps, the voltage bias onside (biased on the target bits) drops.

In one embodiment, the write voltage 506 is selected based on the location of the memory cell in the memory array. The magnitude of the enhancement applied to the write pulse (e.g., write voltage 506) can vary based on the location of the memory cell. In one example, the determination to perform the enhancement is done by searching lookup table 180 in memory of the controller.

In one embodiment, the magnitude of the enhancement to a write pulse (e.g., write voltage 506) is selected based on an extent of error in operation as determined by the controller. In one example, the controller determines an error rate associated with read and/or write operations. Based on the error rate, the controller can adjust the extent of enhancement applied to the write voltage 506.

In one example, the pre-read and write voltages are applied to memory cells 110 or 112 for write operations on memory array 102. In one example, the voltages are generated by bias circuitry 124 as controlled by controller 120. In one example, memory cells 110 are single-level cells (SLCs). In one example, the pre-read voltage is a voltage difference applied across a memory cell from a voltage-biased word line and a voltage-biased bit line that are used to select the cell.

In one example, the pre-read voltages are applied for a time that ranges between 10-100 nanoseconds. In one example, the applied pre-read voltage is 50-600 millivolts. In one example, the applied voltage is 100-300 millivolts. In one example, the memory cells can be multi-state cells, such as MLC, TLC, etc.

In one embodiment, the programming states of memory cells are determined by applying a pre-read voltage to the memory cells during write operations, in accordance with some embodiments. In one example, the memory cells are memory cells 110, and the pre-read voltages are implemented by memory controller 120.

In one example, a pre-read voltage is applied to a total number of 100 memory cells. A current through each memory cell is sensed by a current sensor (e.g., sense amplifier). Memory cells having a current that exceeds a fixed threshold value are considered to snap. Memory cells having a current that is below the fixed threshold value are considered not to snap.

After determining the existing programming state of each memory cell as discussed above, the memory controller makes a determination of a type of programming to use for programming the memory cells. In one embodiment, a normal write programming mode is used. In this mode, the controller determines the target state for each memory cell.

In one example of a normal write programming mode, the memory cells are in a reset state. For each such cell that has a target set state, a write pulse is applied to the memory cell. For each such cell that has a target reset state, no write pulse is applied to the cell.

In one example, the controller determines to implement a force write programming mode. In this mode, each memory cell is selected and an appropriate programming write pulse is applied to the memory cell based on the target state. For example, memory cells are programmed to a target reset state even though the memory cells are already in an existing programming reset state.

Figure 8:
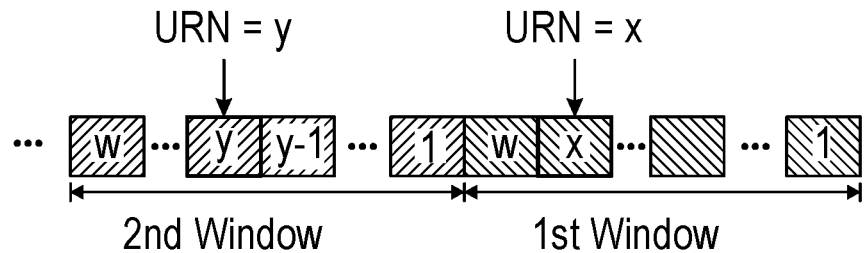
FIG. 8 shows exemplary windows of read operations with each window having a randomly-generated number, according to one embodiment.

FIG. 8 shows exemplary windows of read operations with each window having a randomly-generated number, according to one embodiment. In one example, the random number is generated by random number generator 182. In one example, the random number is a uniform random number (URN).

Each window (e.g., first and second windows as illustrated) corresponds to a fixed number of read operations. For example, each of the illustrated first and second windows corresponds to W read operations. One example, each window corresponds to W=100 read operations.

In one example, for each window a random number is selected. The random number is used to probabilistically choose one read operation within each window. For example, for the first window the read operation indicated by "x" corresponds to the random number generated for the first window. For example, for the second window the read operation indicated by "y" corresponds to the random number generated for the second window.

In one example, controller 120 performs read operations for various addresses corresponding to read commands received from host device 126. For a number W of these read operations within the first window, controller 120 selects the read operation corresponding to a read count of "x", which is determined by the generated random number as described above. For a subsequent number W of these read operations within the second window, controller 120 selects the read operation corresponding to a read count of "y", which is determined by the generated random number as described above.

Subsequent read operations correspond to subsequent windows. Each subsequent window has a read operation randomly selected using a random number generator or other random approach.

The randomly-selected read operation from each window is added to a lookup table or other record that stores data regarding the selected read operations. In one example, the lookup table is lookup table 180. In one example, the read operation is added to the lookup table by adding the corresponding address of the bits or codeword that are read during the read operation. In one example, after the read operations above, lookup table 180 contains various address entries.

In one example, random selection is done on every W read operations, where one read on a specific codeword CW is selected randomly by a uniform random number (URN). For example, the read counts 5, 171, 246, . . . are selected, which corresponds to using uniform random numbers (e.g., URNs=5, 71, 46 . . . ) in every 100 reads on memory array 102.

The randomly selected codewords CWs are recorded in a lookup table (LUT) every time when selected (multiple selection is possible in some cases). In one example, the lookup table is built up by a first-in, first-out (FIFO) content-addressable memory.

As described above for example, when a write command is received by a controller, and the write command is for a RESET on SET write on a codeword CW inside the lookup table, the enhanced RESET programming is triggered. After completing the foregoing write operation, the codeword CW is deleted from the lookup table.

In alternative embodiments, other types of read counters (e.g., counters 104) can be used to select codewords for adding to the lookup table. The read counters are not required to use random numbers.

Figure 9:
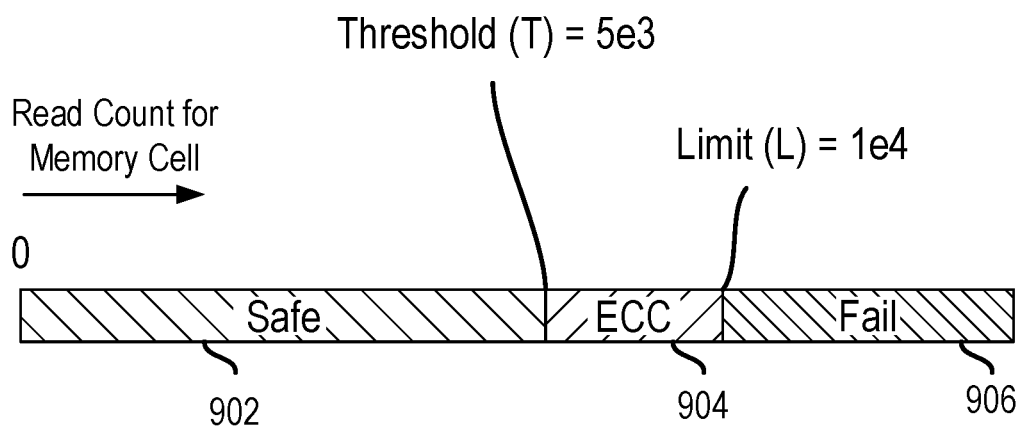
FIG. 9 shows exemplary ranges of operation for memory cells, according to one embodiment.

FIG. 9 shows exemplary ranges of operation for memory cells, according to one embodiment. For any given typical cell, it is expected that for any read count (e.g., read disturb count) up to the threshold T, the cell can be safely read without any error. For read counts above the threshold T and up to a limit L (e.g., read disturb limit), it is expected that error correction using an error correction code (ECC) can be used by a controller to correct any errors. For read counts above the limit L, is expected that the read operation on the cell will fail and cannot be corrected using error correction.

In one example, the threshold T is 5K reads. A window size W of 100 read operations is used. The 5K read count is divided into different windows of size W (e.g., 5K divided by 100 provides 50 windows that are used). For each window, a random number is selected. For example, the random number 5 is used for the first 100 reads. Then, those target cells (e.g., codeword) touched (e.g., involved in a read operation) by the 5th read are recorded in the lookup table. It is typically expected for this example that 50 codewords will be recorded in the lookup table. In some cases, by randomness, there can be duplicate codewords. In one example, the lookup table records the x, y or x, y, z coordinates of the codeword in the memory array. The lookup table is expected to most likely include those codewords that have been touched most frequently.

Figure 10:
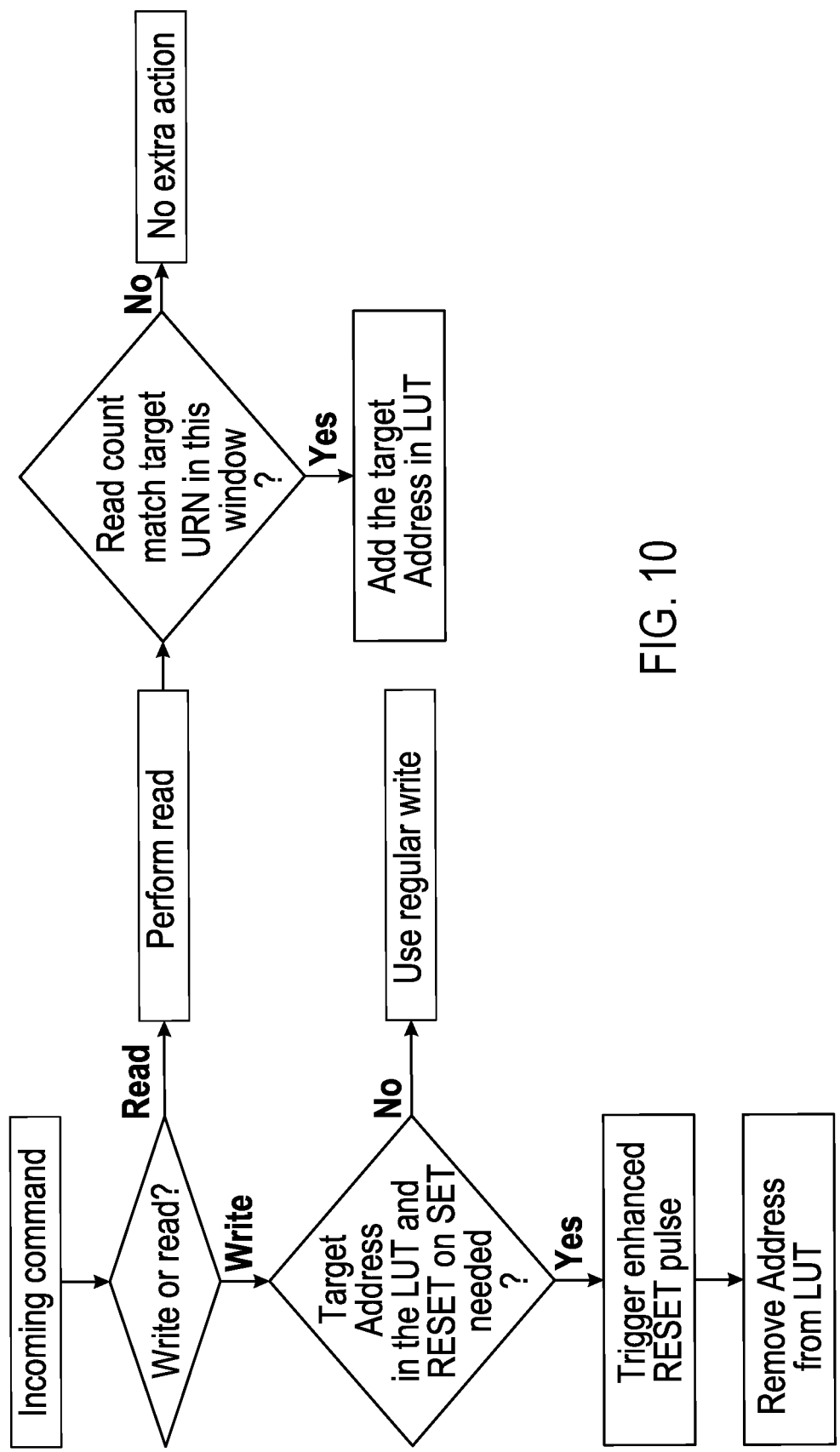
FIG. 10 shows a flowchart for triggering an enhanced write pulse based on a lookup table generated from prior read operations, according to one embodiment.

FIG. 10 shows a flowchart for triggering an enhanced write pulse based on a lookup table from prior read operations, according to one embodiment. In one example, the lookup table is lookup table 180. In one example, the prior read operations are prior reads on memory array 102.

As illustrated, a controller receives an incoming command and evaluates the command to determine whether it is a read command or write command. If it is a read command, the controller performs a read operation.

As part of the read operation, the controller compares a read count of the read operation to a random number that has been randomly generated, such as described above for example. If the read count matches the random number for the current read window (e.g., the current set of 100 read operations in a first window as described above), then the address of the memory cells being read in the current read operation are added to a lookup table. If the read count does not match, then the address is not added to the lookup table.

If the incoming command is a write command, the controller compares the target address of the write command to the addresses in the lookup table. The controller also determines the type of write operation.

If both the target address is found in the lookup table, and the type of write operation is a reset on set (e.g., RESET on SET) write operation, then an enhanced write pulse (e.g., RESET pulse) is triggered. After using the enhanced write pulse, the target address of the write operation is removed from the lookup table.

If either the target address is not found in lookup table, or type of write operation is not a reset on set write operation, then a normal default write pulse is used (e.g., a regular write operation on memory array 102).

Figure 11:
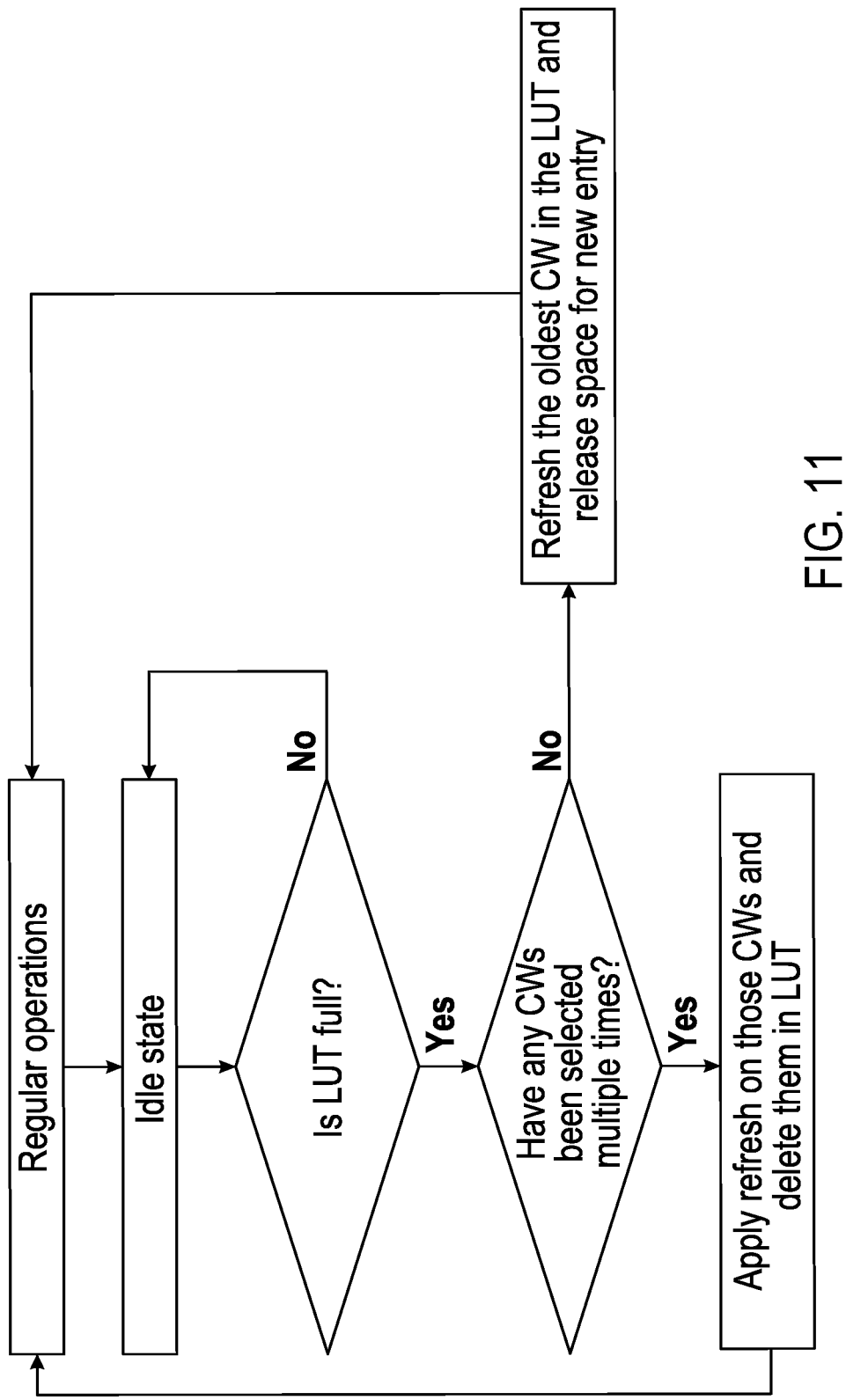
FIG. 11 shows a flowchart for maintaining a lookup table, according to one embodiment.

FIG. 11 shows a flowchart for maintaining a lookup table, according to one embodiment. In one example, the lookup table is lookup table 180.

A controller (e.g., controller 120) maintains the entries in the lookup table. In one embodiment, when the controller is not performing regular operations (e.g., read and/or write operations), and the controller is in an idle state, the controller does maintenance on the lookup table. The controller determines the extent of usage of the capacity of the lookup table to determine if the lookup table is full or almost full (e.g., the extent of usage exceeds a threshold such as 90% full). If the lookup table is not full, then no more maintenance action is taken.

If the lookup table is determined to be full or almost full, the controller removes one or more entries from the lookup table. In one embodiment, the controller identifies addresses for codewords that have been recorded in the lookup table multiple times (e.g., 2 or more times). The controller performs a refresh on those codewords, then deletes the corresponding address entries from the lookup table. This provides storage space in the lookup table for new entries for subsequent read operations.

In one embodiment, if no codewords have been selected multiple times, then one or more of the older codewords in the lookup table are refreshed, and then the corresponding address entries in the lookup table are deleted. This provides storage space in the lookup table for new entries.

In one example, the size of the LUT is limited (e.g., <=1K address entries) to minimize the searching time when doing write operations. If the LUT overflows (e.g., exceeds its capacity) for the codewords CWs in the LUT, and some of the codewords CWs are captured multiple times (e.g., 2 times), this indicates those codewords CWs have a higher possibility of having been read many times. For those codewords, a toggled refresh is applied (e.g., 1 RESET+1 SET) on SET bits (e.g., data_bar+data on all bits in the codewords CWs). Then those addresses are removed from the lookup table. If the lookup table is still overflowing after the foregoing, then the controller can refresh some or all of the other recorded codewords CWs in the lookup table, then remove the corresponding entries from the lookup table.

Figure 12:
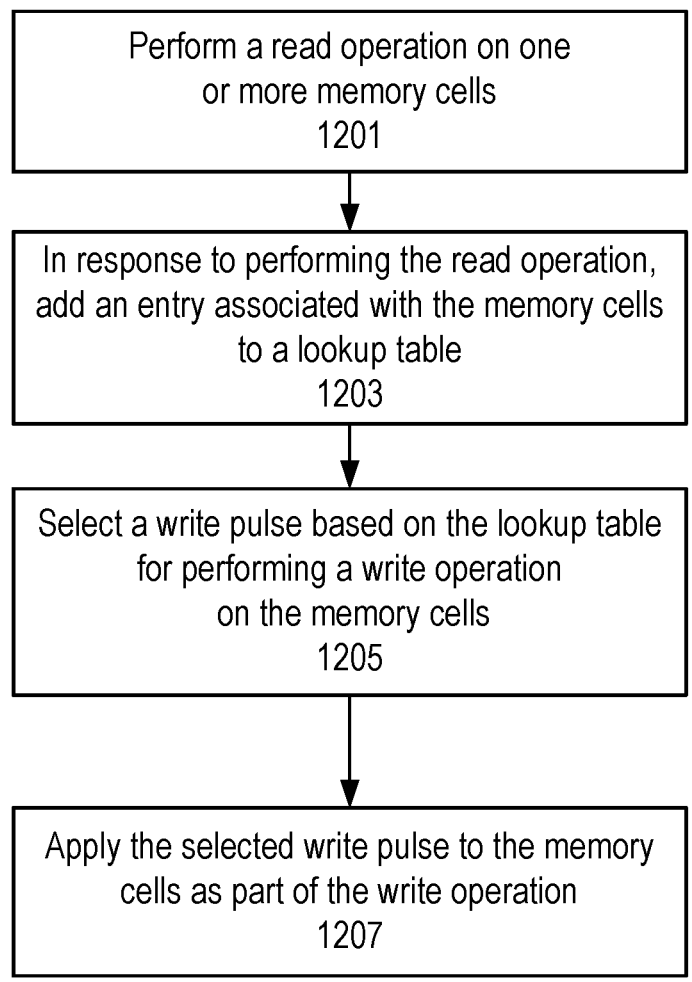
FIG. 12 shows a method for determining whether to enhance a write pulse based on entries made to a lookup table from prior read operations, in accordance with some embodiments.

FIG. 12 shows a method for determining whether to enhance a write pulse based on entries made to a lookup table from prior read operations, in accordance with some embodiments. For example, the method of FIG. 12 can be implemented in the system of FIG. 1.

The method of FIG. 12 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 12 is performed at least in part by one or more processing devices (e.g., controller 120 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1201, a read operation is performed on one or more memory cells. In one example, controller 120 receives a read command from host device 126.

At block 1203, in response to performing the read operation, an entry associated with the memory cells is added to a lookup table. In one example, a read count of the read command matches a random number. In one example, the lookup table is lookup table 180.

At block 1205, a write pulse(s) is selected based on the lookup table. The write pulse(s) (e.g., series of increased write voltages) is used for performing a write operation on the memory cells. In one example, lookup table 180 has been built up over prior read operations. Then, controller 120 receives a write command from host device 126. In response to receiving the write command, controller 120 selects a write pulse. To select the write pulse, controller 120 searches lookup table 180 to determine if an address of the write command matches an address in the lookup table 180. If there is a match, the write pulse is selected to be an enhanced write voltage and/or current (e.g., controlled magnitude of spike current) of a magnitude greater than a default or normal voltage and/or current (e.g., normal spike current limit) (e.g., used for memory cells that have not been previously read and/or that are not expected to have an imprint risk).

At block 1207, the selected write pulse is applied to the memory cells as part of the write operation. In one example, bias circuitry 124 applies the enhanced write voltage to memory cells 110. In one example, bias circuitry 124 applies a control voltage to circuitry (e.g., vary a gate voltage applied to a current limiter) that increases a magnitude of a spike current that is permitted to flow through memory cells 110 when they snap. Then, the address entry in the lookup table corresponding to memory cells 110 is deleted.

In one embodiment, a system comprises: a memory array (e.g., 102) including memory cells; bias circuitry (e.g., 124) configured to apply pulses (e.g., voltages) to the memory cells when performing read and write operations, wherein for the write operations the pulses include a first write pulse, and a second write pulse that is stronger than the first write pulse to at least partially remediate any existing imprint effect on the memory cells (e.g., using an enhanced RESET write pulse); memory configured to store a record (e.g., lookup table 180) associated with prior read operations for the memory cells; and a controller (e.g. 120) configured to: perform at least one read operation on at least one first memory cell of the memory array; in response to performing the read operation, add a first entry associated with the first memory cell to the record; select, for performing a write operation on the first memory cell, a write pulse based on the record stored in the memory, wherein the selecting comprises determining that the first entry is in the record, and in response to determining that the first entry is in the record, selecting the second write pulse; and apply, using the bias circuitry, the second write pulse to the first memory cell for performing the write operation.

In one embodiment, the record based on the prior read operations is a lookup table.

In one embodiment, the controller is further configured to, after applying the second write pulse to the first memory cell, remove the first entry from the record.

In one embodiment, the controller is further configured to: determine whether the write operation is of a type that increases a magnitude of a threshold voltage of the first memory cell; wherein the second write pulse is selected further in response to determining that the write operation is of the type that increases the magnitude of the threshold voltage.

In one embodiment, the write operation is a reset on set write operation.

In one embodiment, the controller is further configured to: apply, as part of the write operation, a pre-read voltage to the first memory cell; wherein determining whether the write operation is of the type that increases the magnitude of the threshold voltage is based on applying the pre-read voltage.

In one embodiment, the pre-read voltage is applied to determine an existing state of the first memory cell, and determining whether the write operation is of the type that increases the magnitude of the threshold voltage comprises comparing the existing state to a target state for the first memory cell.

In one embodiment, the system further comprises a random number generator (e.g., 182), wherein adding the first entry to the record is performed based on a random number generated by the random number generator.

In one embodiment, the system further comprises a counter (e.g., 104) configured to count a number of read operations associated with at least a portion of the memory cells, wherein adding the first entry to the record is performed based on the number of read operations (e.g., a read count compared to a random number).

In one embodiment, the system further comprises sensing circuitry (e.g., 122) configured to sense at least one current through the first memory cell during the read operation.

In one embodiment, the at least one first memory cell stores bits for a codeword, and the read operation is performed in response to receiving a read command for an address corresponding to the codeword.

In one embodiment, the first entry is an address in the memory array, and the write operation is performed in response to receiving a write command to write a codeword corresponding to the address.

In one embodiment, the controller is further configured to: compare a count associated with the read operation to a random number; and determine that the count matches the random number; wherein adding the first entry to the record is further in response to determining that the count matches the random number.

In one embodiment, the read operation is associated with an address of a codeword stored in the memory array, and the first entry added to the record is the address.

In one embodiment, the write operation is a first write operation performed in response to receiving a first write command (e.g., a write command received from host device 126), the record is a lookup table, and the controller is further configured to: receive a second write command associated with an address; determine that the address is not in the lookup table; in response to determining that the address is not in the lookup table, select the first write pulse for performing a second write operation on at least one second memory cell associated with the address; and apply, using the bias circuitry, the first write pulse to the second memory cell.

In one embodiment, the write operation is a first write operation performed in response to receiving a first write command, the record is a lookup table, and the controller is further configured to: receive a second write command to store first data; determine whether a second write operation corresponding to the second write command is of a type that decreases a magnitude of a threshold voltage of at least one second memory cell (e.g., writing to a target SET state from an existing RESET state); in response to determining that the second write operation is of the type that decreases the magnitude of the threshold voltage, select the first write pulse; and apply, using the bias circuitry, the first write pulse to the second memory cell.

In one embodiment, the record is a lookup table that stores addresses associated with prior read operations on the memory array, and the controller is further configured to: determine whether an extent of data stored in the lookup table has reached a threshold (e.g., the lookup table is full or 90% full); and in response to determining that the extent of data stored has reached the threshold, perform a refresh operation for at least one second memory cell corresponding to at least one first address, and after performing the refresh operation remove the first address from the lookup table.

In one embodiment, the controller is further configured to: determine that the first address is stored at least two times in the lookup table; wherein performing the refresh operation and removing the first address from the lookup table are performed further in response to determining that the first address is stored at least two times in the lookup table.

In one embodiment, the first address is selected for removal from the lookup table based on an age of the first address.

In one embodiment, the first address is an oldest address in the lookup table (e.g., the lookup table is operated in a first-in, first-out (FIFO) manner).

In one embodiment, a system comprises: at least one memory; bias circuitry configured to apply voltages and/or currents to memory cells of the memory, wherein for write operations the voltages and/or currents include a first voltage and/or current, and a second voltage and/or current of a greater magnitude than the first voltage and/or current; sensing circuitry configured to read the memory cells; memory configured to store a table having addresses selected based on read operations; and a controller configured to: perform, using the sensing circuitry, a read operation for at least one first memory cell at a first address; determine, based on a characteristic of the read operation, whether to add the first address to the table; in response to determining to add the first address to the table, add the first address to the table; receive a write command associated with the first address; in response to receiving the write command, determine whether the first address is in the table; in response to determining that the first address is in the table, select the second voltage and/or current; apply, using the bias circuitry, the second voltage and/or current to the first memory cell; and remove the first address from the table.

In one embodiment, the characteristic is a count (e.g., read count) of the read operation, and determining to add the first address comprises determining that the read count matches a random number.

In one embodiment, the read operation is a first read operation, the random number is a first random number, and the system further comprises a random number generator configured to generate the first random number for a first range of the count (e.g., a first window of 100 read operations), and to generate a second random number for a second range of the count (e.g., a second window of 100 read operations), wherein the second random number is used for determining whether to add a second address to the lookup table for a second read operation.

In one embodiment, the first and second ranges each have a fixed size corresponding to a selected number of read operations (e.g., a number W of read operations is selected by the controller or a host device) (e.g., a fixed window size of 100 read operations is used for each window).

In one embodiment, the characteristic is a read count associated with the first memory cell.

In one embodiment, the controller is further configured to: determine that an extent of data stored in the table has reached a threshold; and in response to determining that the extent of data has reached the threshold, refresh memory cells associated with one or more addresses in the table, and remove the one or more addresses from the table.

In one embodiment, a method comprises: performing at least one read operation on at least one memory cell; in response to performing the read operation, adding an entry associated with the memory cell to a table; selecting, based on the table, a write voltage and/or current for performing a write operation on the memory cell, wherein the selecting comprises determining that the entry is in the table, and in response to determining that the entry is in the table, enhancing the write voltage and/or current (e.g., selecting a write voltage that is stronger than a normal write voltage); and applying the enhanced write voltage and/or current to the memory cell as part of the write operation.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit)

component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A system comprising:
a memory array including memory cells;
memory configured to store a record associated with prior read operations for the memory cells; and
a controller configured to:
apply pulses to the memory cells when performing read and write operations, wherein for the write operations the pulses include at least one first write pulse, and at least one second write pulse of a greater magnitude than the first write pulse;

perform at least one read operation on at least one first memory cell of the memory array;

in response to performing the read operation, add a first entry associated with the first memory cell to the record;

select, for performing a write operation on the first memory cell, a write pulse based on the record stored in the memory, wherein the selecting comprises determining that the first entry is in the record, and in response to determining that the first entry is in the record, selecting the second write pulse; and apply the second write pulse to the first memory cell for performing the write operation.

2. The system of claim 1, wherein the record based on the prior read operations is a lookup table.

3. The system of claim 1, wherein the controller is further configured to, after applying the second write pulse to the first memory cell, remove the first entry from the record.

4. The system of claim 1, wherein the controller is further configured to:

determine whether the write operation is of a type that increases a magnitude of a threshold voltage of the first memory cell;

wherein the second write pulse is selected further in response to determining that the write operation is of the type that increases the magnitude of the threshold voltage.

5. The system of claim 4, wherein the write operation is a RESET on SET write operation.

6. The system of claim 4, wherein the controller is further configured to:

apply, as part of the write operation, a pre-read voltage to the first memory cell;

wherein determining whether the write operation is of the type that increases the magnitude of the threshold voltage is based on applying the pre-read voltage.

7. The system of claim 6, wherein the pre-read voltage is applied to determine an existing state of the first memory cell, and determining whether the write operation is of the type that increases the magnitude of the threshold voltage comprises comparing the existing state to a target state for the first memory cell.

8. The system of claim 1, further comprising a random number generator, wherein adding the first entry to the record is performed based on a random number generated by the random number generator.

9. The system of claim 1, further comprising a counter configured to count a number of read operations associated with at least a portion of the memory cells, wherein adding the first entry to the record is performed based on the number of read operations.

10. The system of claim 1, further comprising sensing circuitry configured to sense at least one current through the first memory cell during the read operation.

11. The system of claim 1, wherein the at least one first memory cell stores bits for a codeword, and the read operation is performed in response to receiving a read command for an address corresponding to the codeword.

12. The system of claim 1, wherein the first entry is an address in the memory array, and the write operation is performed in response to receiving a write command to write a codeword corresponding to the address.

13. The system of claim 1, wherein the controller is further configured to:

compare a count associated with the read operation to a random number; and determine that the count matches the random number;

wherein adding the first entry to the record is further in response to determining that the count matches the random number.

14. The system of claim 1, wherein the read operation is associated with an address of a codeword stored in the memory array, and the first entry added to the record is the address.

15. The system of claim 1, wherein the write operation is a first write operation performed in response to receiving a first write command, the record is a lookup table, and the controller is further configured to:

receive a second write command associated with an address;

determine that the address is not in the lookup table;

in response to determining that the address is not in the lookup table, select the first write pulse for performing a second write operation on at least one second memory cell associated with the address; and apply the first write pulse to the second memory cell.

16. The system of claim 1, wherein the write operation is a first write operation performed in response to receiving a first write command, the record is a lookup table, and the controller is further configured to:

receive a second write command to store first data;

determine whether a second write operation corresponding to the second write command is of a type that decreases a magnitude of a threshold voltage of at least one second memory cell;

in response to determining that the second write operation is of the type that decreases the magnitude of the threshold voltage, select the first write pulse; and apply the first write pulse to the second memory cell.

17. The system of claim 1, wherein the record is a lookup table that stores addresses associated with prior read operations on the memory array, and the controller is further configured to:

determine whether an extent of data stored in the lookup table has reached a threshold; and in response to determining that the extent of data stored has reached the threshold, perform a refresh operation for at least one second memory cell corresponding to at least one first address, and after performing the refresh operation remove the first address from the lookup table.

18. The system of claim 17, wherein the controller is further configured to:

determine that the first address is stored at least two times in the lookup table;

wherein performing the refresh operation and removing the first address from the lookup table are performed further in response to determining that the first address is stored at least two times in the lookup table.

19. The system of claim 17, wherein the first address is selected for removal from the lookup table based on an age of the first address.

20. The system of claim 19, wherein the first address is an oldest address in the lookup table.

21. A system comprising:

at least one memory;

sensing circuitry configured to read the memory cells;

memory configured to store a table having addresses selected based on read operations; and a controller configured to:

apply pulses to memory cells of the memory, wherein for write operations the pulses include at least one first pulse, and at least one second pulse that is enhanced relative to the first pulse;

perform, using the sensing circuitry, a read operation for at least one first memory cell at a first address;

determine, based on a characteristic of the read operation, whether to add the first address to the table;

in response to determining to add the first address to the table, add the first address to the table;

receive a write command associated with the first address;

in response to receiving the write command, determine whether the first address is in the table;

in response to determining that the first address is in the table, select the second pulse;

apply the second pulse to the first memory cell; and remove the first address from the table.

22. The system of claim 21, wherein the characteristic is a count of the read operation, and determining to add the first address comprises determining that the read count matches a random number.

23. The system of claim 22, wherein the read operation is a first read operation, the random number is a first random number, and the system further comprises a random number generator configured to generate the first random number for a first range of the count, and to generate a second random number for a second range of the count, wherein the second random number is used for determining whether to add a second address to the lookup table for a second read operation.

24. The system of claim 23, wherein the first and second ranges each have a fixed size corresponding to a selected number of read operations.

25. The system of claim 21, wherein the characteristic is a read count associated with the first memory cell.

26. The system of claim 21, wherein the controller is further configured to:

determine that an extent of data stored in the table has reached a threshold; and in response to determining that the extent of data has reached the threshold, refresh memory cells associated with one or more addresses in the table, and remove the one or more addresses from the table.

27. A method comprising:

performing at least one read operation on at least one memory cell;

in response to performing the read operation, adding an entry associated with the memory cell to a table;

selecting, based on the table, a write pulse for performing a write operation on the memory cell, wherein the selecting comprises determining that the entry is in the table, and in response to determining that the entry is in the table, enhancing the write pulse; and applying the enhanced write pulse to the memory cell as part of the write operation.

* * * * *